United States Patent [19]

Ema

[11] Patent Number: 5,554,556
[45] Date of Patent: Sep. 10, 1996

[54] METHOD OF MAKING A SEMICONDUCTOR MEMORY DEVICE HAVING AN INCREASED CAPACITANCE OF MEMORY CELL

[75] Inventor: Taiji Ema, Kawasaki, Japan

[73] Assignee: Fujitsu Limited, Kawasaki, Japan

[21] Appl. No.: 423,092

[22] Filed: Apr. 18, 1995

Related U.S. Application Data

[62] Division of Ser. No. 210,735, Mar. 21, 1994, which is a continuation of Ser. No. 725,783, Jul. 9, 1991, abandoned.

[30]   Foreign Application Priority Data

Jul. 9, 1990  [JP]  Japan ..................... 2-181896

[51] Int. Cl.⁶ ............................................. H01L 21/8242
[52] U.S. Cl. ................... 437/52; 437/60; 437/80; 437/229; 437/919
[58] Field of Search ....................... 437/47, 48, 52, 437/60, 919, 229, 80

[56]            References Cited

U.S. PATENT DOCUMENTS 5,272,103  12/1993  Nakamura ................................. 437/52

FOREIGN PATENT DOCUMENTS 0022474  1/1995  Japan ........................................ 437/52

*Primary Examiner*—Tom Thomas
*Attorney, Agent, or Firm*—Staas & Halsey

[57]                ABSTRACT

A semiconductor memory device comprises a plurality of memory cell transistors each provided on a substrate in correspondence to a word line and a bit line, and a memory cell capacitor provided in each of the memory cell transistors in electrical connection to a diffusion region formed in the memory cell transistor. The memory cell capacitor comprises a first electrode defined by an upper major surface and a lateral surface that surrounds the first electrode, a dielectric film covering the upper major surface and the lateral surface of the first electrode, and a second electrode covering the dielectric film in correspondence to the upper major surface and the lateral surface of the first electrode, wherein the lateral surface of the first electrode has an undulating form defined by a smooth curve to increase the capacitance of the memory cell capacitor.

4 Claims, 11 Drawing Sheets

34

METHOD OF MAKING A SEMICONDUCTOR MEMORY DEVICE HAVING AN INCREASED CAPACITANCE OF MEMORY CELL

This application is a division of application No. 08/210,735, filed Mar. 21, 1994, now pending; a continuation of application No. 07/725,783, filed Jul. 9, 1991, now abandoned.

BACKGROUND OF THE INVENTION

The present invention generally relates to semiconductor devices, and more particularly to a semiconductor memory device having a memory cell capacitor for storage of information and a fabrication process thereof.

Dynamic random access memories (DRAM) use memory cell capacitors for storing binary information in the form of electric charges. The memory device includes a number of memory cells, and each memory cell includes therein a MOS transistor having a gate connected to a word line, a source connected to a bit line and a drain connected to a memory cell capacitor. Upon energization of the word line and bit line, the electric charges are transferred from the memory cell capacitor to the bit line when reading data. When writing data, the word line is energized and the electric charges are transferred from the bit line to the memory cell capacitor. The minute voltage change appearing on the bit line in response to the electric charge transfer at the time of reading is then detected by a sense amplifier.

The memory cell capacitor generally comprises a polysilicon electrode body on which a thin dielectric film is deposited, and an opposing electrode is further deposited on the dielectric film such that the dielectric film is sandwiched between the polysilicon electrode body and the opposing electrode. The polysilicon electrode body is connected to the drain of the MOS transistor of the memory cell while the opposing electrode is connected to the ground.

With the requirement of increased memory capacity of semiconductor memories, the integration density of the semiconductor memories is increasing continuously. Such an increase in the integration density inevitably causes a reduction in the size of the polysilicon body used for the memory cell capacitor, and there occurs a problem in that the capacitance of the memory cell capacitor is not sufficient for storing data.

FIG. 1 shows a conventional semiconductor memory device 10 in the plan view while FIG. 2 shows the cross section of the device of FIG.1 along a line 2'—2' in FIG. 1.

Referring to FIGS.1 and 2, there is provided a substrate 11 that is covered by a field oxide region 12 except for a device region 14 on which a memory cell transistor 16 is formed. In the plan view of FIG. 1, the device region 14 is defined by a boundary 14a.

In the illustrated example, the substrate 11 is doped to the p-type and diffusion regions 18 and 20, both of the n-type, are formed within the substrate 11 in correspondence to the device region 14, as the source and drain of the memory cell transistor 16. Thereby, a p-type channel region 19 is formed in the substrate between the diffusion regions 18 and 20.

In correspondence to the channel region 19, there is provided a gate insulation film 22 and a polysilicon gate electrode 24 is provided on the gate insulation film 22 as usual. The gate electrode 24 is embedded in an insulation layer 26 and extends generally in the column direction in FIG.1 as a word line WL. In correspondence to where the word line WL passes through the device region 14, the word line WL extends in the vicinity of the substrate 11 as the gate electrode 24 as described previously, while the word line WL is located on the field oxide region 12 in the rest of the device.

As usual in the memory cell transistor, the diffusion region 18 is exposed at the surface of the substrate 11 via a contact hole 28 formed in the insulator layer 26 to penetrate through the gate insulator film 22, and a bit line BL extending in the row direction in the plan view of FIG. 1 contacts to the exposed diffusion region 18 via the contact hole 28.

The bit line BL is buried under an insulator layer 30, and a contact hole 32 is provided through the insulator layer 30 as well as through the underlying insulator layer 26 and the gate insulator film 22, such that the diffusion region 20 forming the drain of the memory cell transistor 16 is exposed. In contact with the exposed diffusion region 20, there is provided a polysilicon body 34 on the insulator layer 30 as the accumulation electrode of a memory cell capacitor 36.

As shown in the plan view of FIG. 1, the memory cell capacitor 36 has a generally rectangular form. Associated therewith, the polysilicon body 34 has a corresponding rectangular form. The polysilicon body 34 has a generally undulated top surface in correspondence to the contact hole 32, while the lateral surface of the body 34 extends straight in the lateral as well as vertical directions. The top surface and the side surface of the polysilicon body 34 are covered by a thin dielectric film 38, typically with a thickness of 60 Å, and a polysilicon layer 40, acting as an electrode opposing the accumulation electrode 34 of the memory cell capacitor, is provided on the dielectric film 38.

Further, an insulator layer 42 having a planarized top surface is provided on the polysilicon layer 40, and an aluminum layer 44 is provided on the insulator layer 42 for the interconnection within the device. The cross sectional view of FIG.2 shows the state before the aluminum layer 44 is patterned for forming the wiring pattern. Thus, one can see a photoresist layer 46 provided on the aluminum layer 44. The insulator layer 42 may be formed from a PSG.

In such a memory cell device, the area that is occupied by the memory cell capacitor 36 in the plan view decreases with increasing integration density. Associated therewith, there is a tendency that the height of the polysilicon body 34 and hence the height of the memory cell capacitor 36 is increased in order to secure sufficient capacitance of the capacitor 36. However, such an increase in the height of the memory cell capacitor causes an increase in the level of the planarized top surface of the insulator layer 42 and hence the level of the aluminum layer 44 that is to be patterned using the photoresist layer 46 as the mask.

It should be noted that the semiconductor memory device in general has peripheral devices 48 such as address buffers, row and column decoders, sense amplifiers, input and output buffers, and the like at the peripheral part of the device, and the interconnection to these peripheral devices is formed also by patterning the aluminum layer 44. In patterning the aluminum layer 44, it is necessary to conduct an exposure process to expose the photoresist layer 46 to an ultraviolet radiation that is passed through a suitably patterned mask.

As the memory cell capacitor 36 projects upward, the level of the photoresist layer 46 differs in the memory cell region located above the memory cell transistors 16 or capacitors 36 and in the peripheral region located above the peripheral device 48. Thereby, there appears a level difference d as illustrated. With the increase in the integration density, the upward projection of the memory cell capacitor 36 increases as already described, and the level difference d increases accordingly.

With the difference d thus increased, there occurs a difficulty in focusing the ultraviolet beam properly at the time of exposure of the photoresist layer 46. More specifically, there arises a problem in that the radiation of the ultraviolet beam on the photoresist layer 46 becomes insufficient in the peripheral region when the ultraviolet beam is focused on the photoresist layer 46 of the memory cell region. When the ultraviolet beam is focused on the peripheral region, on the other hand, the radiation on the memory cell region becomes insufficient, In order to achieve the satisfactory focusing of the ultraviolet radiation beam for both the memory cell region and the peripheral region, it is necessary to increase the focal depth of the optical system used for focusing the beam. However, such an increase in the focal depth inevitably invites a degradation of resolution as will be examined closely hereinafter.

Generally, the focal depth of an optical system is given by the equation $$\text{focal depth} \propto \lambda N_A^2$$

where $\lambda$ stands for the wavelength of an optical beam that is focused by the optical system and $N_A$ represents the numeric aperture of the optical system used for focusing.

On the other hand, the resolution limit achieved by such an optical system is given as $$\text{resolution limit} \propto \lambda N_A.$$

As can be seen from the latter equation, the resolution limit decreases with decreasing wavelength and increasing numeric aperture $N_A$. In other words, by using a shortwave radiation and an optical system having a large numeric aperture $N_A$, one can produce smaller patterns. However, such a selection inevitably causes a decrease in the focal depth as can be seen in the former equation and hence the difficulty in focusing the optical beam simultaneously on the photoresist 46 covering the memory cell region and on the photoresist 46 covering the peripheral region.

FIG. 3(A) shows the polysilicon body 34 and FIG. 3(B) shows a schematic representation of the polysilicon body 34, as a rectangular body characterized by lateral edges a and b and a height d.

In the memory cell capacitor 36 formed on such a polysilicon body 34, the capacitance C is given as $$C = S \cdot \epsilon / t$$

where $\epsilon$ represents the dielectric constant of the dielectric film 38, S represents the surface area of the polysilicon body 34 covered by the dielectric film 38, and t represents the thickness of the dielectric film 38.

In the semiconductor memory device having the 64 Mbit memory capacity (64M DRAM), a capacitance of about 30 fF is required for the value of C for storage of information, while the parameter $\epsilon/t$ is set to about 7 fF/$\mu^2$. It should be noted that the parameter $\epsilon$ is determined by the material of the dielectric film and cannot be increased as desired. The thickness t, too, cannot be decreased excessively, as the film 38 has to cover the top surface as well as the side surfaces of the polysilicon body 34 uniformly and without interruption.

Under the circumstances, one needs to secure a surface area of about 4 $\mu^2$ for the value of S. In the 64M DRAM device where the edges a and b of FIG. 3(B) are set generally to 1.4 $\mu$m and 0.6 $\mu$m, this means that a size of about 0.8 $\mu$m is necessary for the value of the height d. It should be noted that the surface area S is given as S=a×b+2(a+b)×d, assuming the rectangular memory cell capacitor. On the other hand, a resolution limit of about 0.3 $\mu$m or less is needed for patterning such a memory device. Thereby, the focal depth cannot become larger than 1 $\mu$m.

It should be noted that the difference between the focal depth and the height d is only 0.2 $\mu$m in the above case. This means that the fabrication of the 64M DRAM according to the foregoing procedure is extremely difficult. On the other hand, use of the ultraviolet exposure process described above is preferable for its high throughput and is particularly suited for the mass production of the low cost semiconductor memories. In order to eliminate this problem, various efforts are made to increase the surface area S of the memory cell capacitor without increasing the height d.

FIG. 4 shows a construction proposed previously by the applicant in the U.S. Pat. No. 4,910,566 for increasing the surface area S of the memory cell capacitor. In this construction, a generally rectangular depression 34$_1$ is formed in the rectangular polysilicon body 34. For example, by setting the size of edges a' and b' of the depression 34$_1$ to be 1.2 $\mu$m and 0.4 $\mu$m and by setting the size of the edge d' to be smaller than the height d by 0.1 $\mu$m, one can attain the foregoing surface area S of 4 $\mu^2$ while maintaining the height d at about 0.5 $\mu$m. In this case, the simultaneous exposure of the photoresist layer 46 in the memory cell region and in the peripheral region is allowed. However, such a process is obviously complex and is not suited for the mass production of the memory cell device.

FIG. 5 shows another conventional proposal for increasing the surface area S of the memory cell capacitor disclosed in the U.S. Pat. No. 4,742,018. In this proposal, projections and depressions are formed on the upper surface of the polysilicon body 34 for increasing the surface area S. This construction, too, is complex and has a problem in mass producing the semiconductor memory cell device.

FIG. 6 shows still another conventional proposal for increasing the surface area S of the memory cell capacitor (see, for example, Yoshimura et al., IEDM Tech. Dig. p.596, 1988). In this prior art, a hemispherical grain silicon (HSG-Si) layer is grown on a polysilicon body 34 that forms the electrode. As the HSG-Si layer has an irregular surface morphology, the surface area of the electrode is significantly increased. This approach, however, has a problem of reliability of the capacitor, as there are a number of sharp projections formed on the surface of the electrode. Such sharp projections tend to invite a concentration of the electric field in the thin dielectric film 38 when the dielectric film is deposited on such an irregular surface. Further, the fabrication process of such a structure is difficult, particularly with respect to the control of the etching process for selectively removing the deposited HSG-Si layer from the device surface except for the surface of the polysilicon body 34.

Thus, there is an acute demand for the design of high density semiconductor memory device that can be fabricated by the ultraviolet exposure process with sufficient capacitance of the memory cell capacitor while maintaining the height of the memory cell capacitor small.

SUMMARY OF THE INVENTION

Accordingly, it is a general object of the present invention to provide a novel and useful semiconductor memory device wherein the foregoing problems are eliminated.

Another and more specific object of the present invention is to provide a semiconductor memory device having a memory cell capacitor for storing information in the form of electric charges, wherein the height of the memory cell capacitor is decreased while maintaining sufficient capacitance for the memory cell capacitor.

Another object of the present invention is to provide a semiconductor memory device having a memory cell capacitor, said memory cell capacitor having a generally rectangular form defined by a top surface and side walls that surround the memory cell capacitor, wherein the side wall of the memory cell capacitor is undulated. According to the present invention, one can increase the surface area of the memory cell capacitor and hence the capacitance, without increasing the height of the memory cell capacitor. Thereby, the difference in the level of the memory cell device, between the memory cell region and the peripheral region is reduced, and the exposure process for patterning the semiconductor memory device is achieved by using an optical radiation in a single step for both the memory cell region and the peripheral region.

Other objects and further features of the present invention will become apparent from the following detailed description when read in conjunction with the attached drawings.

DETAILED DESCRIPTION

Figure 1:
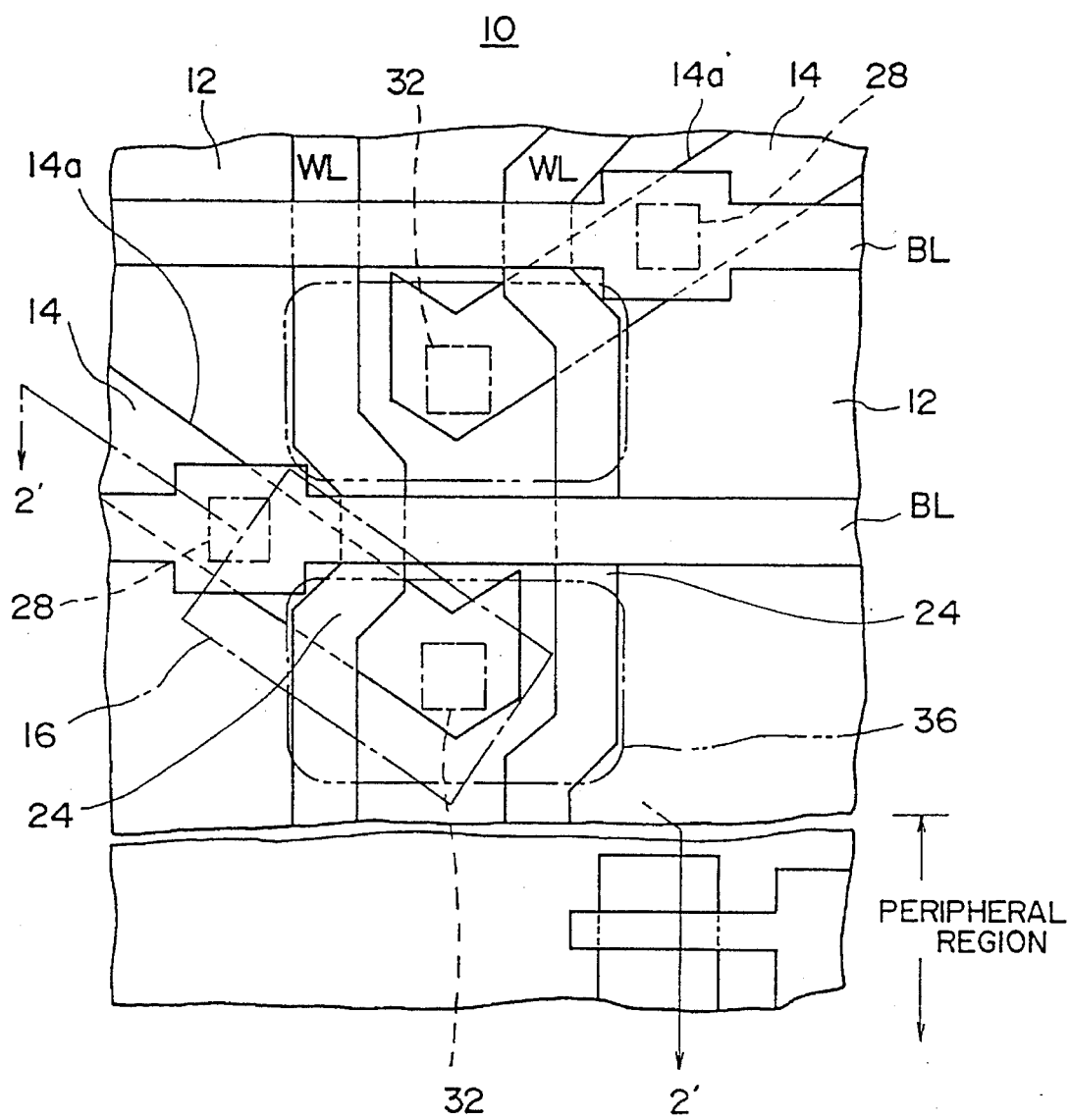
FIG. 1 is a diagram showing the plan view of a conventional semiconductor memory device.
Figure 2:
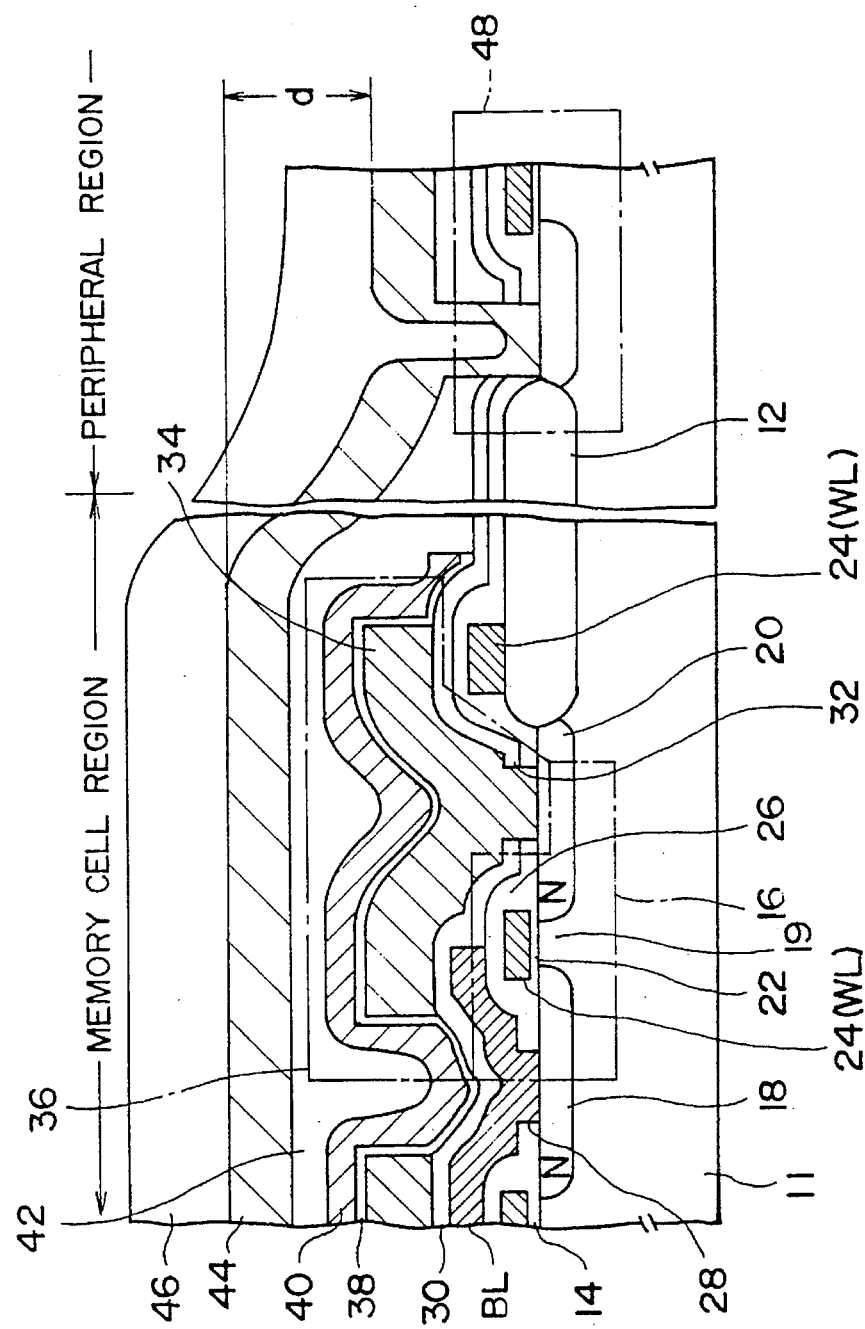
FIG. 2 is a cross sectional view of the memory device of FIG. 1 along line 2'—2' in FIG. 1.
Figure 7:
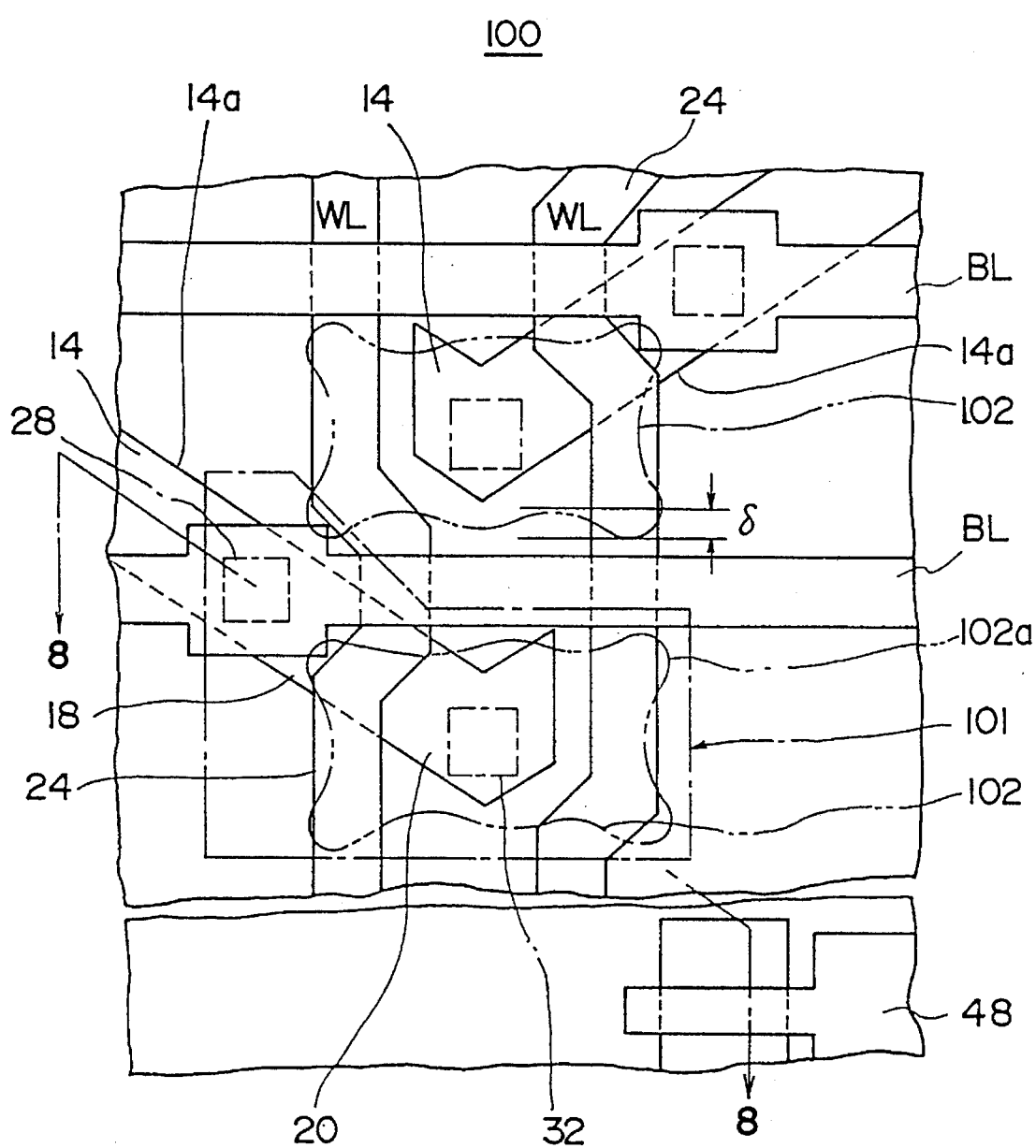
FIG. 7 is a plan view showing a first embodiment of the semiconductor memory device of the present invention.
Figure 8:
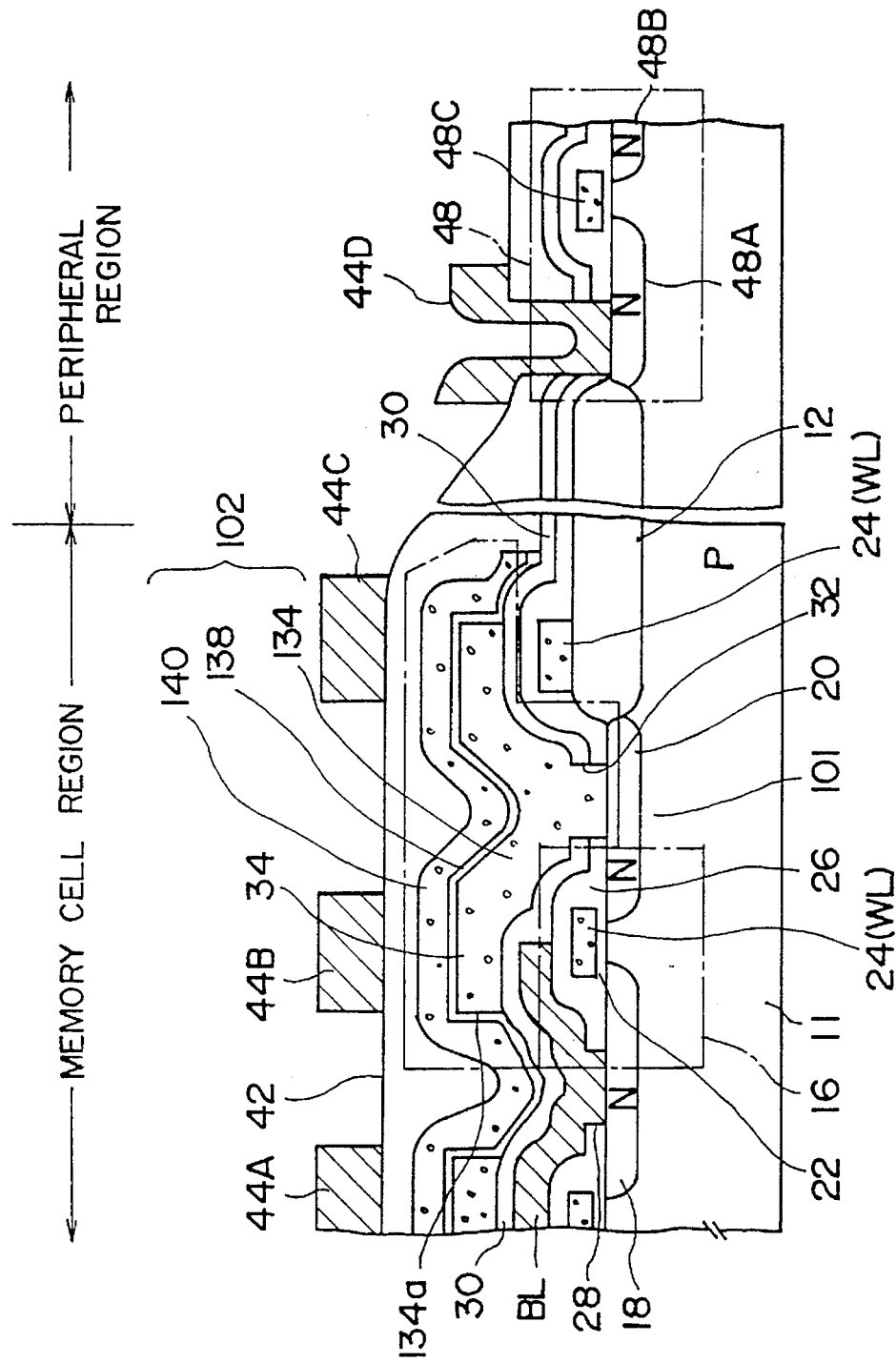
FIG. 8 is a cross sectional view of the semiconductor memory device of FIG. 7 along line A—A in FIG. 7.

FIG. 7 and 8 show a dynamic random access memory device 100 according to a first embodiment of the present invention. In the drawings, the parts that correspond to those described previously with reference to FIGS. 1 and 2 are designated by the same reference numerals and the description will be omitted.

Referring to FIGS. 7 and 8, the semiconductor memory device 100 of FIG. 7 includes a number of memory cells 101 each including the memory cell transistor 16 and a generally rectangular memory cell capacitor 102 as usual, wherein the rectangular memory cell capacitor 102 is now formed to have a nominal rectangular shape and specifically to have a periphery defined by an undulated (i.e., curvilinear) side wall 102a having a cross-section in a plane parallel to the main surface comprising a succession of alternate, convex and concave semicircular segments which are interconnected and, respectively, project outwardly of and inwardly of the nominal rectangular periphery.

Associated with the construction of the memory cell capacitor 102 as set forth above, the polysilicon electrode body designated by a numeral 134 and establishing a contact with the drain region 20 of the memory cell transistor 16 now has a generally (i.e., nominally) rectangular form characterized by an undulated side wall 134a. The polysilicon body 134 of course corresponds to the polysilicon body 34 of FIG.2 and is covered by a dielectric film 138 corresponding to the dielectric film 38. See the cross sectional view of FIG. 8 taken in a plane along line 8—8 in FIG. 7. The dielectric film 138 may be made of silicon oxide and has a thickness of typically 60 Å. Further, the dielectric film 138 is covered by a polysilicon layer 140 corresponding to the polysilicon layer 40 and forms a capacitor structure in which the dielectric film 138 is sandwiched between the polysilicon body 134 and the polysilicon layer 140.

The memory cell capacitor 102 thus formed is then buried under the PSG layer 42 and the aluminum layer on the PSG layer 42 is patterned to form interconnection patterns 44A, 44B, 44C as shown in the cross section of FIG.8. Simultaneously to the patterning of the interconnection patterns 44A–44C, an interconnection electrode 44D is formed in correspondence to the peripheral device 48. As shown in FIG.8, the peripheral device 48 comprises a MOS transistor having n-type diffusion regions 48A and 48B formed in the substrate 11 as the source and drain. Further, a gate electrode 48C is formed as usual to the MOS transistor.

In the present embodiment, the surface area S of the memory cell capacitor 102 is increased because of the undulated configuration of the side wall of the 134a of the polysilicon body 134. Typically, the amplitude of undulation represented in FIG. 7 by $\delta$ is set to about 0.15 µm. The formation of such an undulated side wall by photolithographic patterning will be described later.

Figure 3A:
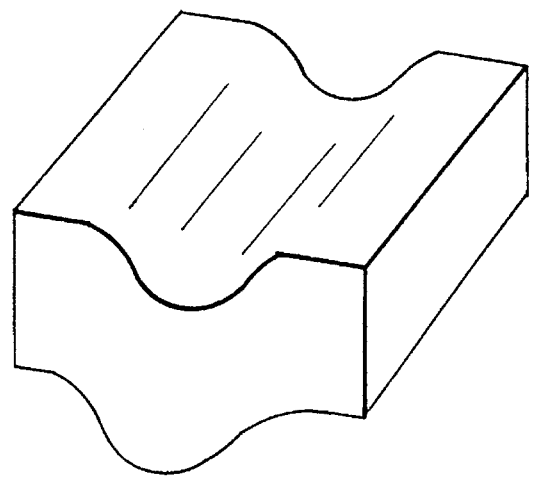
FIGS. 3(A) and 3(B) are diagrams showing a memory cell capacitor, as used in the semiconductor memory device of FIG. 1, in a perspective view.
Figure 3B:
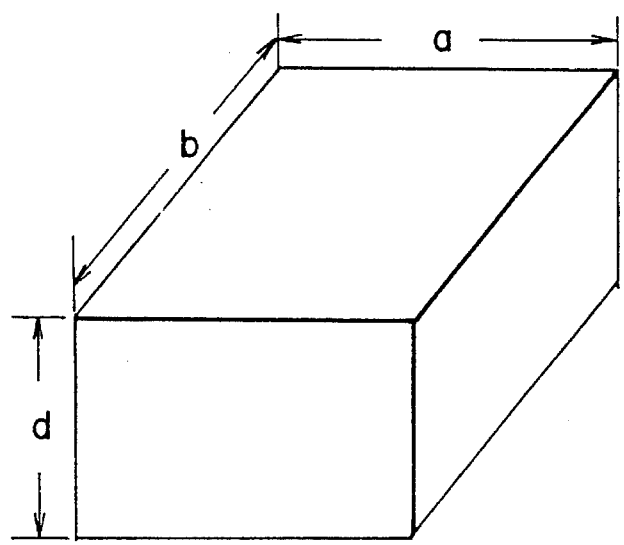

Referring to FIG. 3(B) again, the surface area S of surface of the polysilicon body 34 is given as $$S = a \times b + 2(a+b) \times d$$

Now, when the surrounding a+b of the polysilicon body 134 is increased by 1.5 times than that of the polysilicon body 34 associated with the undulated construction of the side surface 134a, it can be shown, by a simple calculation, that the height d can be reduced to about 0.5 µm while maintaining the surface area S of 4 µm². As noted before, the surface area of about 4 µm² is needed for securing sufficient capacitance of the memory cell capacitor for the 64M DRAM device.

Assuming the resolution limit of 0.3 µm and the focal depth of 1 µm in the ultraviolet exposure process for patterning the interconnections 44A–44D similarly as before, this reduction in the height d provides a tolerance of as much as 0.5 µm for the focal depth of the ultraviolet beam while still maintaining the desired capacitance of 30 fF for the memory cell capacitor 102. In other words, the height of the memory cell capacitor 102 is reduced from about 0.8 µm to about 0.5 µm while maintaining a sufficient capacitance, and the high resolution patterning of the interconnection wiring 44A–44D for both the memory cell region and the peripheral region becomes possible by the photolithographic process. Thereby, an efficient production of the large capacity semiconductor memory devices such as 64M DRAM devices, is achieved safely while using the photolithographic patterning process.

Next, the fabrication process of the semiconductor memory device of FIG. 8 will be described with reference to FIGS. 9(A)–9(F).

Figure 9A:
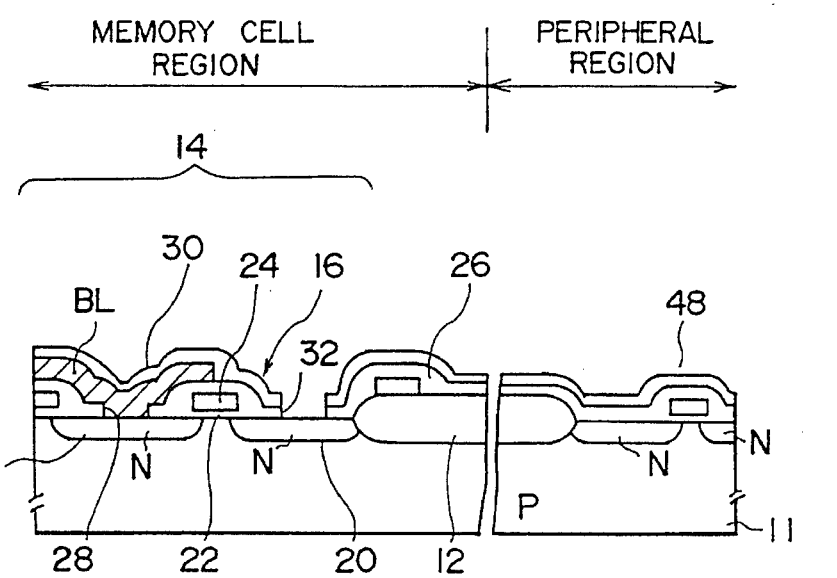
FIGS. 9(A)–9(E) are diagrams showing the fabrication process of the semiconductor memory device of FIG.7.

Referring to FIG. 9(A) first, the substrate 11 is formed with the field oxide region 12 and the gate oxide film 22 is formed on the exposed surface of the device region 14. After providing the gate electrode 24 of polysilicon, the diffusion regions 18 and 20 are formed at respective, opposite sides of the gate electrode 24 by ion implantation. Thereby, the memory cell transistor 16 is formed. Simultaneously to the formation of the memory cell transistor 16, the peripheral device 48 similarly is formed in the peripheral region.

After the formation of the memory cell transistor 16 and the peripheral device 48, the transistors 16 and 48 are covered by the insulator layer 26, and the contact hole 28 is formed, extending through both the insulator layer 26 and the gate insulator film 22. Further, a polysilicon layer is deposited on the structure thus obtained to establish a contact to the exposed diffusion region 18 via the contact hole 28, and is patterned, subsequently, to form the bit line BL. Next, the insulator layer 30 is deposited on the structure thus formed and a contact hole 32 is formed through the layers 22, 26 and 30 to expose the diffusion region 20. Thereby, the structure of FIG. 9(A) is obtained.

Figure 9B:
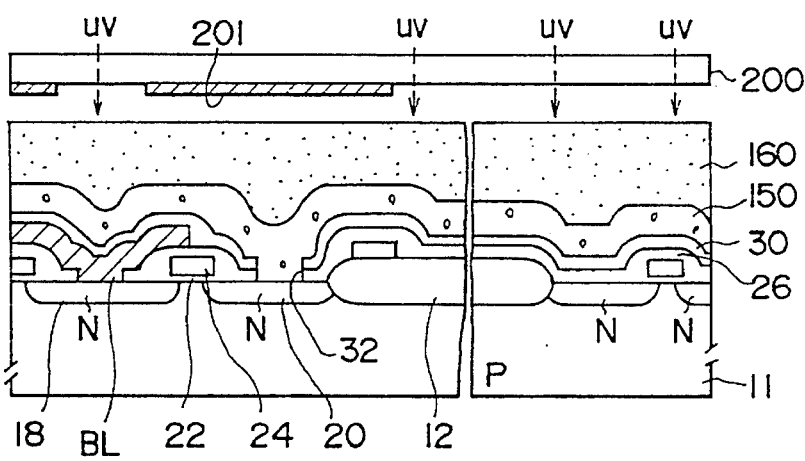

Next, a polysilicon layer 150 is deposited on the entire surface of the structure of FIG. 9(A) and a photoresist layer 160 is deposited on the polysilicon layer 150. Further, by using a mask 200 to be described in detail later, the photoresist 160 is exposed to an ultraviolet radiation UV as shown in FIG. 9(B). The mask 200 carries thereon an opaque pattern 201 of chromium, and the like, for writing a desired pattern on the photoresist 160.

Figure 9C:
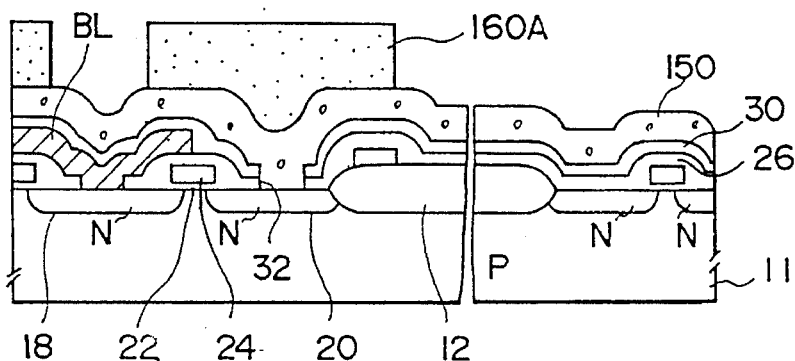
Figure 9D:
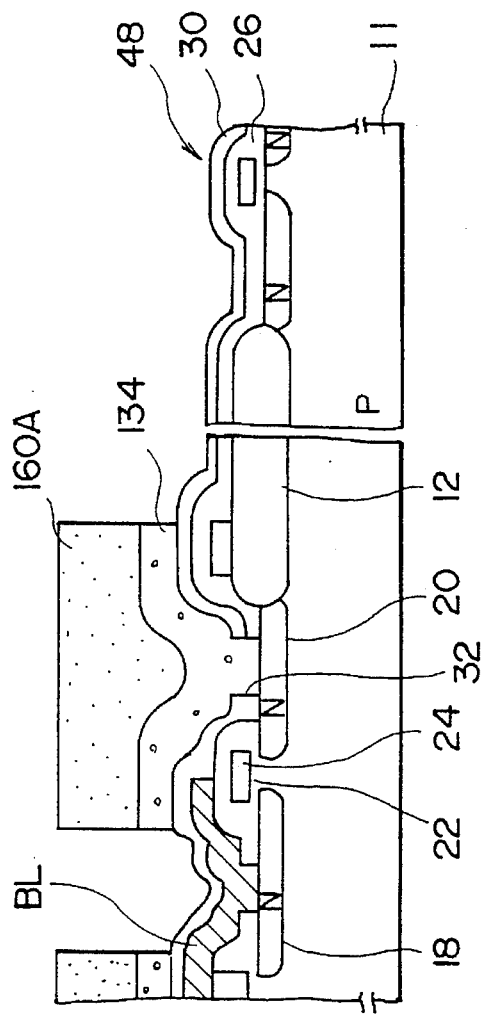

After the exposure of FIG. 9(B), the photoresist 160 is developed as shown in FIG. 9(C) wherein a patterned photoresist 160A is formed. Further, by using the patterned photoresist 160A as the mask, the polysilicon layer 150 is patterned by an RIE process, and a structure shown in FIG. 9(D) is obtained.

Figure 9E:
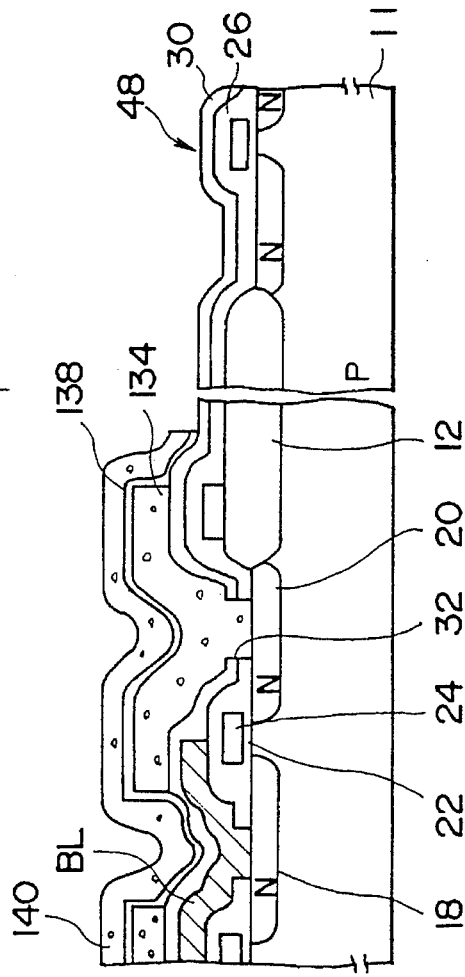

Next, the photoresist 2160A is removed and the dielectric film 138 and the polysilicon layer 140 are deposited successively. Further, the dielectric film 138 and the polysilicon layer 140 are removed from the peripheral region. Thereby, the structure shown in FIG. 9(E) is obtained. The structure of FIG. 9(E) is then covered by the PSG layer 42 and the aluminum layer is deposited on the PSG layer 42. By patterning the aluminum layer by an RIE process, the device of FIG. 8 is obtained.

Figure 10B:
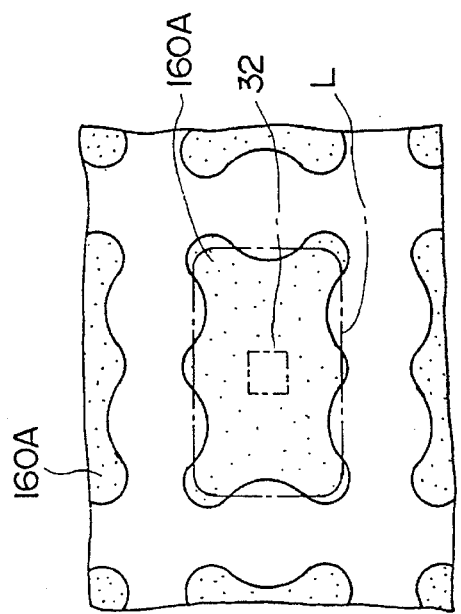
FIGS. 10(A) and 10(B) are diagrams respectively showing the mask used for patterning the device of FIG. 7 and the pattern of photoresist obtained by using the mask of FIG. 10(A)
Figure 10A:
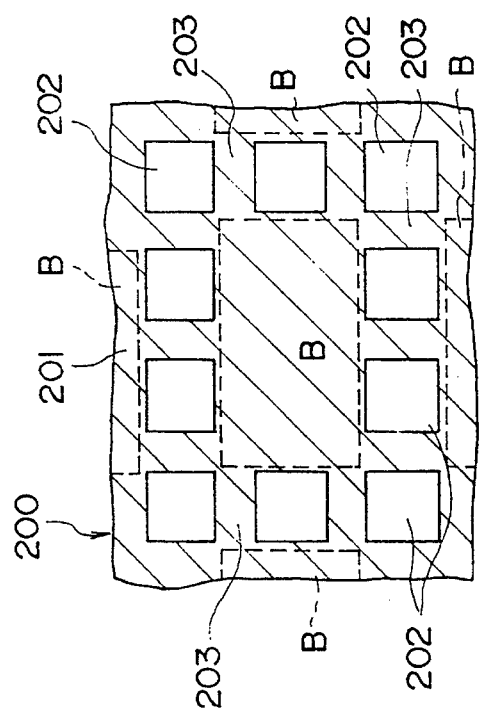

FIG. 10(A) shows the mask 200 used in the step of FIG. 9(B), and FIG. 10(B) shows the photoresist pattern 160A formed by the exposure through the mask 200.

Referring to FIG. 10(A), the mask 200 carries thereon the opaque chromium pattern 201 that is formed with a number of windows 202 such that the windows 202 surround a rectangular region B with a generally uniform interval. Thereby, the rectangular region B is connected to the adjacent rectangular regions B by an opaque part 203 that projects outward from each region B toward the respective adjacent region B. Thus, the projections 203 are separated from each other by the windows 202 while the windows 202 are separated from each other by the projections 203.

The rectangular region B generally corresponds to the memory cell capacitor 102 and may have a size of 0.9 μm×1.6 μm. Each window 202 may have a size of 0.6 μm×0.6 μm and the width l of the projection 203 may be set to about 0.15 μm, which is well below the resolution limit of the ultraviolet exposure system. For example, the ultraviolet exposure system may have a resolution limit of about 0.5 μm.

Figure 6:
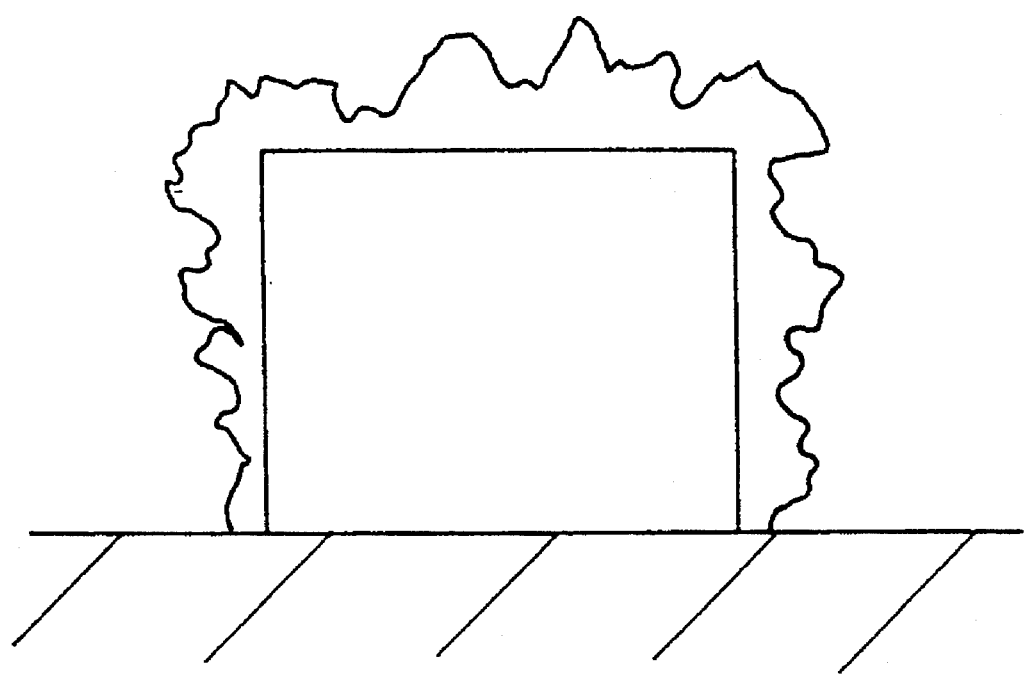

At the time of ultraviolet exposure, the duration of exposure is set larger than usual. For example, the duration may be set to several tens of milliseconds and which is twice as long as the usual process. Thereby, the ultraviolet beam passing through the windows 202 causes a diffraction and reach the photoresist 160 at the region beyond the part that is normally exposed. By arranging the windows 202 to surround the region B, one obtains the photoresist pattern 160A that is surrounded by the undulated lateral surface. As a result of the patterning in the process of FIG. 9(D) by using the photoresist pattern 160A as the mask, the polysilicon body 134 that has the undulated side wall is obtained. As the pattern is formed as a result of the diffraction of the optical beam, the side wall of the polysilicon body 134 is defined by a smooth curve that is advantageous for eliminating the local concentration of electric field. With this respect, the semiconductor memory device of the present invention is definitely advantageous over the prior art device of FIG. 6.

Figure 11B:
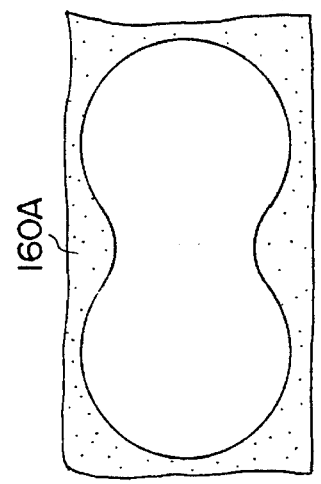
FIGS. 11(A) and 11(B) are diagrams showing the mask and the patterned photoresist in an enlarged scale.
Figure 11A:
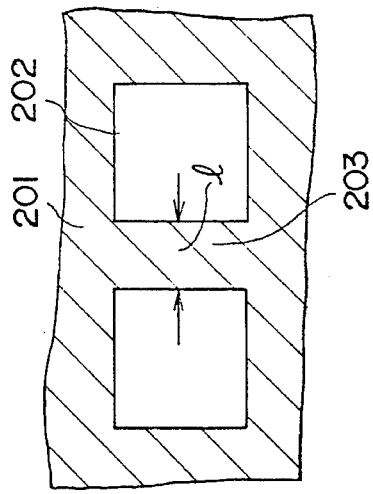

FIG. 11(A) shows an enlarged view of a part of the mask 200 of FIG. 10(A), and FIG. 11(B) shows a patterned photoresist 160A that is exposed via the mask part of FIG. 11(A). As described previously, the width l of the part 203 is set smaller than the resolution limit of the exposure system. Thereby, the ultraviolet beam passing through the windows 202 undergoes a diffraction and diffuses outside of the window 202. Thus, the optical pattern that is written on the photoresist layer takes a form as shown in FIG. 11(B) which is characterized by the smooth, undulated side wall.

Figure 12A:
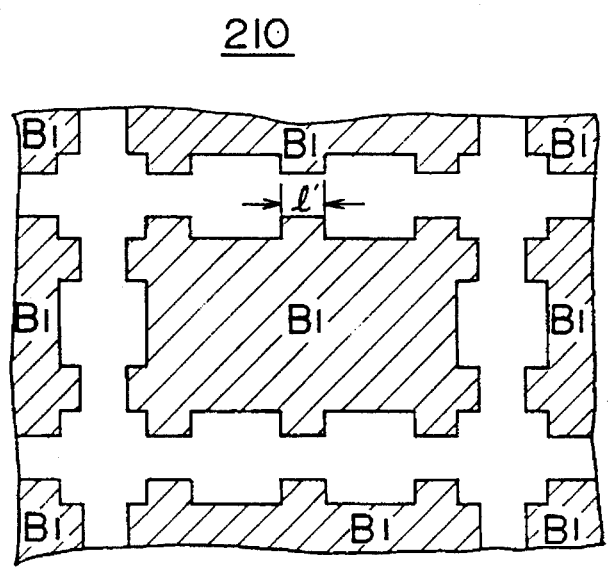
FIGS. 12(A) and 12(B) are diagrams showing other examples of the mask.
Figure 12B:
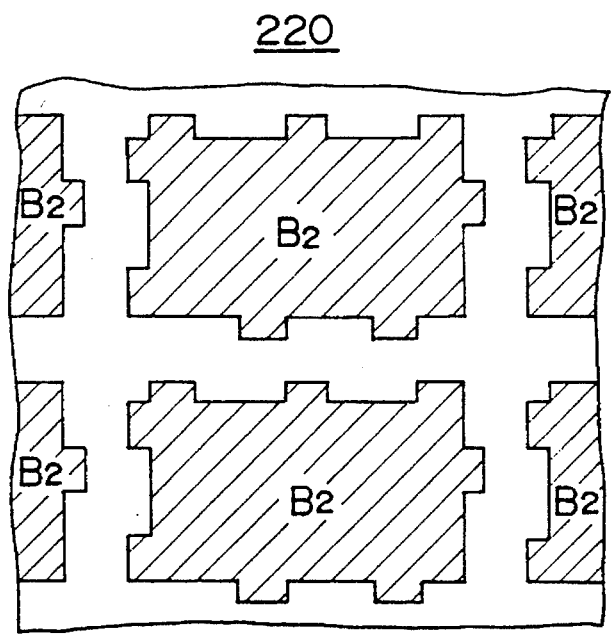

The mask pattern forming the undulated side wall of the memory cell capacitor 102 is not limited to those shown in FIGS. 10(A) and 11(A). FIGS. 12(A) and 12(B) show other examples of mask patterns used for the same purpose. In a mask 210 of FIG. 12(A), a number of opaque chromium patterns $B_1$ of generally rectangular shape are formed with a separation sufficiently larger than the resolution limit, wherein each pattern $B_1$ is formed with rectangular projections generally corresponding to the undulated side wall of the memory cell capacitor to be formed. It will be seen that these projections correspond to the projections 203 of FIG. 10(A). In the example of FIG. 12(A), however, the projections do not connect together the adjacent patterns $B_1$. A similar projection is formed in a mask 220 of FIG. 12(B) that includes an opaque pattern $B_2$. The projections are generally symmetrical in the example of FIG. 12(A), and each rectangular projection has an edge that is smaller than the resolution limit. In the mask 220 of FIG. 12(B), the opaque pattern $B_2$ is asymmetric.

Any of these masks 210 and 220 can be used in an exposure process to form the undulated side wall of the memory cell capacitor. The size l' of the pattern 210 of FIG. 12(A) may be set larger than the resolution limit of the optical exposure, as long as it does not cause contacting of the patterned, adjacent memory cell capacitors. However, it is preferred to set the size l' less than the resolution limit, thereby to obtain a smooth undulated side wall for the memory capacitor. Obviously, such a smooth side wall reduces the concentration of electric field and improves the reliability of the memory device.

Of course, the process for forming the memory cell capacitor having the undulated side wall is not limited to the foregoing photolithographic patterning. For example, the electron beam exposure process also may be used. Further, the mask itself can be formed easily by the electron beam lithography.

Figure 4:
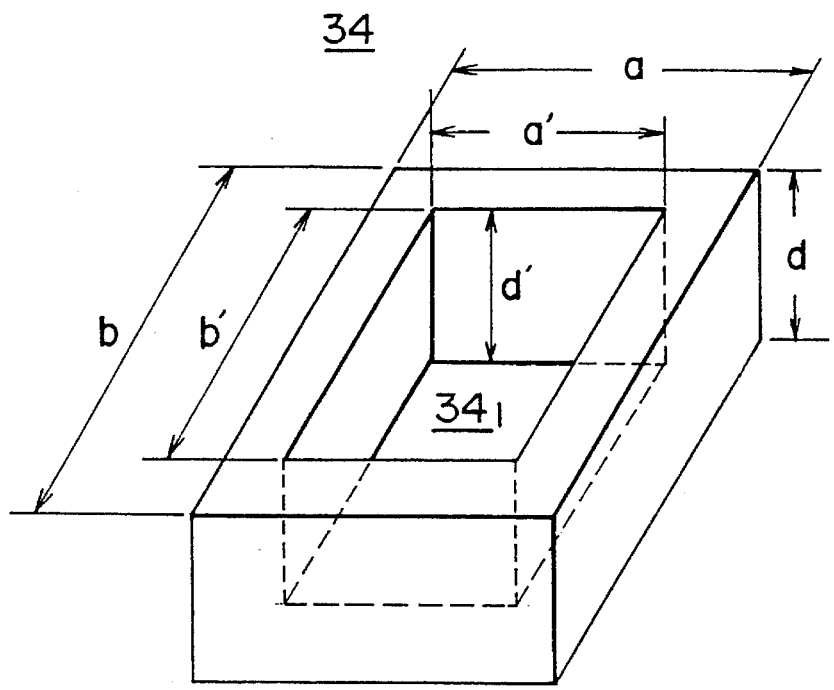
FIGS. 4–6 are diagrams showing the construction of the memory cell capacitor, as proposed previously.
Figure 5:
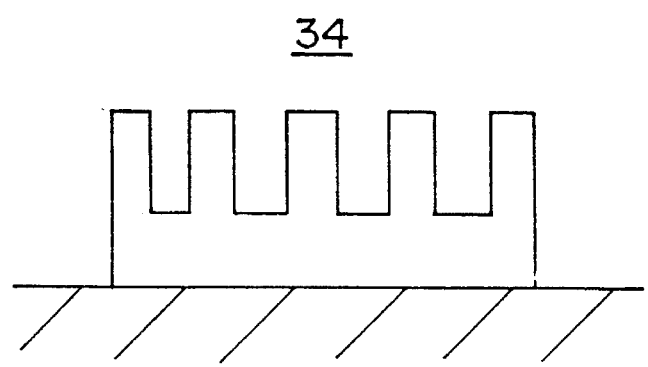

As described previously, the present invention enables the fabrication of semiconductor memory device of increased memory capacity. For example, the 64M DRAM device may be now produced with increased throughput of fabrication. Further, by combining the structures of FIG. 4 or FIG. 5, one can produce a semiconductor memory device of 256 Mbit capacity while securing sufficient capacity for the memory cell.

Further, the present invention is not limited to the embodiments described heretofore, but various variations and modifications may be made without departing from the scope of invention.

What is claimed is:

1. A method for fabricating a semiconductor memory device having a memory cell transistor and a memory cell capacitor, said method comprising the steps of:

forming the memory cell transistor on a substrate;

covering the memory cell transistor by an insulator layer;

providing a contact hole through the insulator layer to expose a part of the memory cell transistor;

depositing a first conductor material layer on the insulator layer such that the first conductor material layer establishes a contact to the exposed part of the memory cell transistor;

depositing a photoresist layer on the first conductor material layer;

exposing the photoresist layer to an optical beam via a mask that carries a plurality of primary patterns each corresponding generally to the pattern of the memory cell capacitor to be formed, said mask further having a plurality of secondary patterns to surround each of the primary patterns, each of said secondary patterns comprising a plurality of projections separated from each other and projecting outward from each of the primary patterns;

patterning the photoresist layer exposed by the optical beam;

patterning the first conductor material layer using the patterned photoresist layer as a mask to form a first electrode of the memory cell capacitor, the first electrode having an upper major surface, of a nominally rectangular configuration and corresponding, nominally rectangular periphery, and a lateral wall substantially perpendicular to the upper major surface of the substrate, the lateral wall defining the actual periphery of the first electrode and, when viewed in a direction perpendicular to the upper major surface of the substrate, the lateral wall having an undulating form defined by a smooth curve extending outwardly and inwardly of the nominally rectangular periphery along the full extent thereof;

depositing a dielectric film on said first conductor material layer to cover a top surface and a side wall of the first electrode; and depositing a second conductive material layer on said dielectric film to cover a top surface and a side wall of the dielectric film respectively corresponding to the top surface and the side wall of the first electrode.

2. A method as claimed in claim 1 in which each projection of the secondary pattern has a width, measured perpendicular to a direction of projection, that is smaller than a resolution limit of the optical beam exposure.

3. A method as claimed in claim 2 in which said optical beam is an ultraviolet beam, and said width has a value of about 0.15 μm.

4. A method as claimed in claim 1 in which said primary patterns are connected with each other by said plurality of projections, said secondary pattern further comprising a plurality of openings separated from each other by the projections such that the projections in turn are separated from each other by the openings.

* * * * *

UNITED STATES PATENT AND TRADEMARK OFFICE
CERTIFICATE OF CORRECTION

PATENT NO. : 5,554,556

DATED : September 10, 1996

INVENTOR(S) : Taiji Ema

It is certified that error appears in the above-indentified patent and that said Letters Patent is hereby corrected as shown below:

On the title page, item [56], insert References Cited:

U.S. PATENT DOCUMENTS

| | | |
|---|---|---|
| 4,742,018 | 05/1988 | KIMURA et al. |
| 4,899,203 | 02/1990 | INO |
| 4,910,566 | 03/1990 | EMA |
| 4,927,772 | 05/1990 | ARTHUR et al. |
| 5,061,654 | 10/1991 | SHIMIZU et al. |

FOREIGN PATENT DOCUMENTS

| | | |
|---|---|---|
| 1-147857 | 06/1989 | JAPAN |
| 39 18 924 | 12/1989 | GERMANY |

OTHER Publications

*PATENT ABSTRACTS OF JAPAN*, Vol. 9, No. 280 (E-356)(2003) 8 November 1985 & JP-A-60 124822 (FUJITSU K.K.) 3 July 1985.

ITO et al., "Photo-Projection Image Distortion Correction for a 1-$\mu$m Pattern Process," *ELECTRONICS AND COMMUNICATIONS IN JAPAN, PART II: ELECTRONICS*, Vol. 69, No. 3, 1986, New York, NY, pages 30-38.

LU et al., "A Substrate-Plate Trench-Capacitor (SPT) Memory Cell for Dynamic RAM's," *IEEE JOURNAL OF SOLID STATE CIRCUITS*, Vol. SC-21, No. 5, October 1986, New York, NY, pages 627-634.

*PATENT ABSTRACTS OF JAPAN*, Vol. 11, No. 212 (E-522)(2659) 9 July 1987 & JP-A-62 35560 (NEC CORP) 16 February 1987.

UNITED STATES PATENT AND TRADEMARK OFFICE
CERTIFICATE OF CORRECTION

PATENT NO. : 5,554,556
DATED : September 10, 1996
INVENTOR(S) : Taiji Ema

It is certified that error appears in the above-indentified patent and that said Letters Patent is hereby corrected as shown below:

KENNY et al., "16-MBIT Merged Isolation and Node Trench SPT Cell (MINT)," *1988 SYMPOSIUM ON VLSI TECHNOLOGY - DIGEST OF TECHNICAL PAPERS*, May 1988, San Diego, CA, pages 25-26.

*PATENT ABSTRACTS OF JAPAN*, Vol. 14, No. 225 (E-927)(4168) 14 May 1990 & JP-A-2 056965 (HITACHI LTD) 26 February 1990.

*PATENT ABSTRACTS OF JAPAN*, Vol. 14, No. 255 (E-935)(4198) 31 May 1990 & JP-A-2 076257 (SHARP CORP) 15 March 1990.

*PATENT ABSTRACTS OF JAPAN*, Vol. 15, No. 144 (P-1189) 11 April 1991 & JP-A-3 020736 (MATSUSHITA ELECTRON CORP) 29 January 1991.

UNITED STATES PATENT AND TRADEMARK OFFICE
CERTIFICATE OF CORRECTION

PATENT NO. : 5,554,556
DATED : Sep. 10, 1996
INVENTOR(S) : EMA

It is certified that error appears in the above-indentified patent and that said Letters Patent is hereby corrected as shown below:

Col. 1, line 6, change "pending" to --abandoned--.

Col. 2, line 29, change "with" to --of--;
line 30, change "A" to --Å--.

Col. 5, line 17, after "region" insert --,--.

Col. 6, line 18, change "A" to --Å--.

Col. 7, line 42, change "2160A" to --160A--.

Col. 8, line 9, change "reach" to --reaches--.

Col. 9, line 4, change "be now" to --now--

Signed and Sealed this

Eighth Day of April, 1997

Attest:

Attesting Officer

BRUCE LEHMAN

Commissioner of Patents and Trademarks